United States Patent
Eliason et al.

(10) Patent No.: US 7,180,141 B2
(45) Date of Patent: Feb. 20, 2007

(54) FERROELECTRIC CAPACITOR WITH PARALLEL RESISTANCE FOR FERROELECTRIC MEMORY

(75) Inventors: Jarrod Randall Eliason, Colorado Springs, CO (US); Glen R. Fox, Colorado Springs, CO (US); Richard A. Bailey, Colorado Springs, CO (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/004,708

(22) Filed: Dec. 3, 2004

(65) Prior Publication Data

US 2006/0118841 A1   Jun. 8, 2006

(51) Int. Cl.
 *H01L 21/331* (2006.01)
 *H01L 29/768* (2006.01)

(52) U.S. Cl. .................................... 257/363; 438/240

(58) Field of Classification Search .................... 438/3, 438/240, 238, 250, 253, 351; 257/295, 363, 257/358–360, 379, 380
See application file for complete search history.

(56) References Cited

U.S. PATENT DOCUMENTS

| | | | |
|---|---|---|---|
| 5,452,178 A | 9/1995 | Emesh et al. | |
| 5,625,529 A * | 4/1997 | Lee et al. | 361/321.5 |
| 5,825,068 A | 10/1998 | Yang | |
| 5,959,878 A | 9/1999 | Kamp | |
| 5,972,722 A | 10/1999 | Visokay et al. | |
| 6,090,697 A | 7/2000 | Xing et al. | |
| 6,144,060 A | 11/2000 | Park et al. | |
| 6,177,351 B1 | 1/2001 | Beratan et al. | |
| 6,225,656 B1 | 5/2001 | Cuchiaro et al. | |
| 6,242,299 B1 | 6/2001 | Hickert | |
| 6,256,220 B1 | 7/2001 | Kamp | |
| 6,261,967 B1 | 7/2001 | Athavale et al. | |
| 6,291,251 B1 | 9/2001 | Nam | |
| 6,323,513 B1 * | 11/2001 | Schindler et al. | 257/296 |
| 6,355,952 B1 | 3/2002 | Yamoto et al. | |
| 6,365,927 B1 | 4/2002 | Cuchiaro et al. | |
| 6,404,668 B2 | 6/2002 | Kowarik et al. | |
| 6,423,592 B1 | 7/2002 | Sun | |
| 6,452,830 B2 | 9/2002 | Kowarik et al. | |

(Continued)

OTHER PUBLICATIONS

"FeRAM Tutorial", Ali Sheikholeslami and P. Glenn Gulak, A survey of circuit Innovations in Ferroelectric random-access memories, Proceedings of the IEEE, vol. 88, No. 3, May 2000, 3 pages, taken from the Internet at: http://www.eecg.toronto.edu/-ali/ferro/tutorial.html.

(Continued)

*Primary Examiner*—Calvin Lee
(74) *Attorney, Agent, or Firm*—Jacqueline J. Garner; W. James Brady, III; Frederick J. Telecky, Jr.

(57) ABSTRACT

Ferroelectric memory cells (3) are presented, in which a cell resistor (R) is integrated into the cell capacitor (C) to inhibit charge accumulation or charge loss at the cell storage node (SN) when the cell (3) is not being accessed while avoiding significant disruption of memory cell access operations. Methods (100, 200) are provided for fabricating ferroelectric memory cells (3) and ferroelectric capacitors (C), in which a parallel resistance (R) is integrated in the capacitor ferroelectric material (20) or in an encapsulation layer (46) formed over the patterned capacitor structure (C).

12 Claims, 8 Drawing Sheets

U.S. PATENT DOCUMENTS

| | | | |
|---|---|---|---|
| 6,495,413 | B2 | 12/2002 | Sun et al. |
| 6,512,256 | B1 | 1/2003 | Cuchiaro et al. |
| 6,528,386 | B1 | 3/2003 | Summerfelt et al. |
| 6,534,809 | B2 | 3/2003 | Moise et al. |
| 6,576,482 | B1 | 6/2003 | Aggarwal et al. |
| 6,576,942 | B2 | 6/2003 | Okutoh et al. |
| 6,610,549 | B1 | 8/2003 | Aggarwal et al. |
| 6,611,014 | B1 | 8/2003 | Kanaya et al. |
| 6,627,935 | B2 | 9/2003 | Kowarik et al. |
| 6,642,100 | B2 | 11/2003 | Yang et al. |
| 6,682,995 | B2 | 1/2004 | Zhang et al. |
| 6,706,540 | B2 | 3/2004 | Hikosaka et al. |
| 6,709,875 | B2 * | 3/2004 | Gilbert et al. ............ 438/3 |
| 6,781,184 | B2 | 8/2004 | Solayappan et al. |
| 2001/0034106 | A1 | 10/2001 | Moise et al. |
| 2001/0044205 | A1 | 11/2001 | Gilbert et al. |
| 2003/0006439 | A1 | 1/2003 | Bailey |
| 2003/0098497 | A1 | 5/2003 | Solayappan et al. |
| 2003/0129847 | A1 | 7/2003 | Celii et al. |
| 2004/0136223 | A1 | 7/2004 | Hsu et al. |

OTHER PUBLICATIONS

"A survey of Circuit Innovations in Ferroelectric Random Access Memories", Ali Sheikholeslami and P. Glenn Gulak, Proceedings of the IEEE, vol. 88, No. 5, May 2000, pp. 667-689.

"Generic CVD Reactor", CVD Basics, Daniel M. Dobkin, Dec. 7, 2001, 3 pages, taken from the Internet at: http://www.batnet.com/enigmatics/semiconductor_processing/CVD_Fundamentals/introdu . . . .

"Physical Vapor Deposition", Cougar Labs, Inc., Dec. 7, 2001, 9 pages, taken from the Internet at: http://www.cougarlabs.com/pvd1.html.

"Parasitic Channel Induced by Spin-On-Glass in a Double-Level Metallization Complimentary Metal Oxide Semiconductor Process", M. Murata, K. Yomauchi, H. Kojima, A. Yokoyama, T. Inoue and T. Iwamori, published in the Journal of Electrochemical Society, vol. 149, No. 8, 1993, pp. 2346-2356.

"Effects of Oxygen Content on Properties of Silicon Oxide Films Prepared at Room Temperature by Sputtering-Type Electron Cyclotron Resonance Plasma", Katsuhiko Furukawa, Yichun Liu, Hiroshi Nakashima, Dawei Gao, Yasuhiro Kashiwazaki, Kiichiro Uchino, Katsunori Muraoka and Hirohisa Tsuzuki, Journal of Applied Physics, vol. 84, No. 8, Oct. 15, 1998, pp. 4579-4584.

Notes taken at the International Symposium on Applications of Ferroelectrics Conference in Nara, Japan in May, 2002. The speaker was H. Nagel of Infineon Technologies and Toshiba Corporation, Key Technologies for High Density FeRAM Application, one page.

"The Hydrogen Content of Plasma-Deposited silicon Nitride", W. A. Lanford and M. J. Rand, American Institute of Physics, J. Appl. Phys. 49(4), Apr. 1978, pp. 2473-2477.

"Free Energy Model for the Analysis of Bonding in a-$Si_xN_yH_z$ Alloys", Z. Yin and W. Smith, J. Vac. Sci. Technol. A. vol. 9. No. 3. MayJun. 1991, pp. 972.

"Comparison Between HCP CVD and PECVD Silicon Nitride for Advanced Interconnect Applications", J. Yota, M. Janani, L.E. Camilletti, A. Kar-Roy, Q.Z. Liu, C. Nguyen, M.D. Woo J. Hander, and P. Van Cleemput. IEEE. 2000. pp. 76-78.

"Hydrogen Role on the Properties of Amorphous Silicon Nitride", F. De Brito Mots, J.F. Justo and A. Fazzio, Journal of Applied Physics, vol. 86, No. 4, Aug. 15, 1999, pp. 1843-1847.

* cited by examiner

FERROELECTRIC CAPACITOR WITH PARALLEL RESISTANCE FOR FERROELECTRIC MEMORY

FIELD OF INVENTION

The present invention relates generally to semiconductor devices and more particularly to methods for fabricating ferroelectric capacitors with a parallel resistance.

BACKGROUND OF THE INVENTION

Memory systems are used for storage of data, program code, and/or other information in many electronic products, such as personal computer systems, embedded processor-based systems, video image processing circuits, portable phones, and the like. Ferroelectric memory, sometimes referred to as "FRAM" or "FERAM", is a non-volatile form of memory commonly organized in single-transistor, single-capacitor (1T1C) or two-transistor, two-capacitor (2T2C) cell configurations, in which each memory cell includes one or more access transistors and one or more cell capacitors formed using ferroelectric dielectric material. The non-volatility of an FERAM memory cell results from a bi-stable or multi-stable characteristic of the ferroelectric dielectric material in the cell capacitor(s), wherein the ferroelectric material has multiple electrically distinguishable stable states. Ferroelectric memory is often fabricated in stand-alone memory integrated circuits (ICs) and/or in other semiconductor products such as logic circuits having on-board non-volatile memory, microprocessors, DSPs, communications chips, etc. The ferroelectric memory cells are typically organized in an array architecture, such as folded-bitline, open-bitline, etc., wherein the individual cells are selected by plateline and wordline signals from address decoder circuitry, with the data being read from or written to the cells along bitlines using latch or sense amp circuits. In a typical 1T1C memory cell, a ferroelectric capacitor is coupled between a plateline signal and a cell storage node at a source/drain of a MOS cell transistor. The other source/drain of the cell transistor is connected to a bitline, and the transistor gate is connected to a wordline control signal to selectively couple the capacitor with the bitline during read and write operations.

The ferroelectric memory arrays are typically constructed in a device wafer along with CMOS logic circuits, wherein the cell transistors are formed concurrently with logic transistors in the device, and the ferroelectric capacitors are constructed in a capacitor layer above the wafer substrate. For example, the construction of the ferroelectric cell capacitors may be integrated into a CMOS fabrication process flow after transistor formation (e.g., after standard 'front-end' processing), and prior to the metalization or interconnection processing (e.g., before 'back-end' processing). In a typical integration of ferroelectric capacitors in a CMOS process flow, transistors are formed on/in a semiconductor body, and a pre-metal dielectric (PMD) layer is constructed over the transistors, including tungsten contacts extending through the PMD level dielectric to the gate and source/drain terminals of the transistors. Ferroelectric cell capacitors are then constructed in a first inter-level or inter-layer dielectric layer (e.g., ILD0) above the PMD level, where one of the cell capacitor electrodes (e.g., a lower or bottom electrode) is connected to a cell transistor terminal (e.g., typically a source/drain) through one of the tungsten PMD contacts, wherein interconnection of the other capacitor electrode (the top or upper electrode) and the remaining transistor terminals with other components (e.g., signal routing) is provided in one or more metalization layers or levels above the ILD0 level.

When a selected cell is read (e.g., along with other cells along a target array row), pulsing the capacitor plateline terminal causes a voltage to develop on the bitline because the cell capacitor discharges through the pass gate transistor to the bitline. Once the bitline signal is amplified by the sense amp, the bitline goes high or low, depending on whether the data is a binary "1" or a "0", respectively. Any excess charge at the storage node of the cell, however, may disrupt or disturb the sensing of the stored data, and in some cases may cause incorrect data to be read out of the cell. In particular, leaky cell transistors may cause unwanted charging or discharging of the cell storage node, sometimes referred to as storage node disturbance.

One possible cause of storage node disturbances occurs where the cell is not selected for a read or write access (e.g., the associated wordline is low and the transistor is theoretically off), and the cell does not receive a plateline pulse. In this situation, accesses to other rows in the memory array along the bitline will cause the bitline voltage to rise. If the non-selected cell transistor leaks, the storage node of the non-accessed cell can acquire or lose charge (the storage node voltage changes) while the associated plateline is low. For example, where the data on the bitline is a "1" (e.g., the bitline is at a high voltage), leakage through the cell transistor may cause charge buildup at the storage node, thereby increasing the voltage across the cell capacitor. Even while reading a "0" data, the voltage on the bitline can rise above 0 V, resulting in a rise or gain in storage node voltage for the cell. This form of storage node disturbance is possible whether the non-accessed cells receive a plateline pulse or not. Another cause may occur where plateline drivers are shared among selected and non-selected rows, wherein leakage through the non-selected cell transistors can result in storage node voltage changes when a plateline pulse is applied to the non-selected cell capacitors.

Such acquired storage node charge may not be dissipated prior to reading the affected cell. Moreover, repeated accesses to other cells may cause this acquired charge to increase over time, wherein the storage node voltage rises. As a result, the signal margin of the system is decreased, and the cell capacitor may even be depolarized from its intended (e.g., programmed) state. Furthermore, such storage node disturbances may be worsened through wordline coupling that temporarily raises the wordline voltage while a different (adjacent) row is being accessed.

Circuit designs can be modified to address these storage node voltages. However, these approaches require extra circuitry thus increasing the chip area occupied by the memory cells and associated circuitry, and may increase the device power consumption and the time required for a memory access operation. Consequently, there is a need for improved ferroelectric memory devices and techniques by which cell storage node disturbances can be mitigated or avoided without increasing the memory cell area and without increasing the memory access time.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

The present invention relates to the ferroelectric memory cells and the fabrication thereof, wherein individual ferroelectric memory cells are provided with a resistance in parallel with a ferroelectric memory cell capacitor in order to facilitate discharging of unwanted storage node voltage buildup in the memory cell caused by leaky cell transistors, while allowing normal read, write, and restore memory access operations. The invention may be advantageously employed to ensure read/write reliability in semiconductor devices employing ferroelectric memory cells, without addition of extra circuitry, without increasing the area of the memory cells, and without increasing memory access times. In addition, the invention provides for integration of the cell resistor into the ferroelectric cell capacitor structure, by which scaling efforts can continue without adding to the memory cell area.

One aspect of the present invention provides a ferroelectric memory cell, comprising a switching device and a ferroelectric capacitor structure with a cell resistor integral to the capacitor structure. The cell may be any cell type, such as a single transistor, single capacitor (1T1C) cell, a 2T2C cell, etc. Any switching device may be employed to provide selective access to the cell capacitor, such as a MOS transistor, which comprises a bitline terminal, a storage node terminal, and a control terminal, where the switching device operates to selectively couple an array bitline at the bitline terminal with a cell storage node at the storage node terminal according to a wordline signal at the control terminal. The ferroelectric capacitor structure comprises first and second electrodes at the cell storage and plateline nodes, respectively, as well as a ferroelectric material, such as PZT (Pb(Zr, Ti)$O_3$) or other ferroelectric, that is at least partially situated between the electrodes.

The memory cell further comprises a cell resistor that is integral to the ferroelectric capacitor structure, where the cell resistor is in contact with the first and second electrodes and provides a resistance between the cell storage node and the cell plateline node that inhibits charge accumulation or charge loss at the cell storage node when the cell is not being accessed without significantly disrupting memory access operations when the cell is being accessed. In one example, the cell resistor provides a resistance of about 20 MOHMS or more and about 100 MOHMS or less between the cell storage node and the cell plateline node. The cell resistor may also advantageously provide a substantially linear I-V characteristic.

In one implementation, the cell resistor comprises an encapsulation layer extending between the first and second electrodes, that provides the parallel resistance between the cell storage node and the cell plateline node. The encapsulation layer may also serve as a hydrogen diffusion barrier that extends along sidewall portions of the electrodes and the ferroelectric material, and may be any suitable resistive material, such as doped aluminum oxide, for example, titanium aluminum nitride (TiAlN) or titanium aluminum oxynitride (TiAlON). In another exemplary implementation, the cell resistor is integral to the ferroelectric material, for example, by controlling the lead content of PZT ferroelectric material to include excess Pb mole fractions of about 10 percent or more and about 30 percent or less, and/or by providing doped PZT material to achieve a resistance between the capacitor electrodes that mitigates charging or discharging of the storage node when the cell transistor is off while allowing normal read, restore, and/or write operation when the cell is accessed.

Another aspect of the invention provides a method of fabricating a ferroelectric memory cell in a semiconductor device. The method comprises forming a switching device with a bitline terminal, a storage node terminal, and a control terminal, and forming a ferroelectric capacitor structure coupled with the storage node terminal of the switching device. The method further comprises forming a cell resistor integral to the ferroelectric capacitor structure, where the cell resistor provides a resistance between first and second electrodes of the ferroelectric capacitor structure. In one implementation, the ferroelectric capacitor structure formation comprises forming a first capacitor electrode layer coupled with the switching device at a cell storage node, forming a ferroelectric material layer coupled with the first capacitor electrode layer, forming a second capacitor electrode layer coupled with the ferroelectric material layer, and patterning (e.g., etching) the ferroelectric material layer and one or both of the electrode layers to form a ferroelectric capacitor structure. In one example, the formation of the cell resistor comprises integrating a resistance into the ferroelectric material, such as by controlling the composition and/or doping thereof to provide resistance between first and second electrodes of the ferroelectric capacitor structure. Another exemplary implementation involves forming the cell resistor using an encapsulation layer such as doped aluminum oxide or other suitable material to provide a resistance between the first and second electrodes.

Yet another aspect of the invention provides a method of fabricating a ferroelectric memory cell capacitor structure in a semiconductor device. The method comprises forming a patterned ferroelectric capacitor structure comprising first and second electrodes and a ferroelectric material at least partially between the first and second electrodes, and integrating a resistor into the ferroelectric material of the patterned ferroelectric capacitor structure, such as by doping the ferroelectric material, where the resistor providing a resistance between the first and second electrodes having a resistance value of about 100 MOHMS or less.

Still another aspect provides a ferroelectric memory cell capacitor fabrication method that comprises forming a patterned ferroelectric capacitor structure comprising first and second electrodes and a ferroelectric material at least partially between the first and second electrodes, and forming an encapsulation layer over at least a portion of the patterned ferroelectric capacitor structure, the encapsulation layer being in contact with the first and second electrodes and providing a resistance between the first and second electrodes.

The following description and annexed drawings set forth in detail certain illustrative aspects and implementations of the invention. These are indicative of but a few of the various ways in which the principles of the invention may be employed.

DETAILED DESCRIPTION OF THE INVENTION

The present invention will now be described with reference to the attached drawing figures, wherein like reference numerals are used to refer to like elements throughout. The invention relates to the provision of a memory cell with a parallel resistance integrated into a ferroelectric cell capacitor stack structure, by which the adverse effects (e.g., disturb voltage) of leaky memory cell access transistors may be mitigated in semiconductor devices employing ferroelectric memory. The invention may be carried out in any type of semiconductor device, for example, devices having memory cells with ferroelectric cell capacitors or other devices, such as integrated circuits in which ferroelectric capacitors are used. The various aspects and advantages of the invention are hereinafter illustrated and described in conjunction with the drawings, wherein the illustrated structures are not necessarily drawn to scale.

Figure 1A:
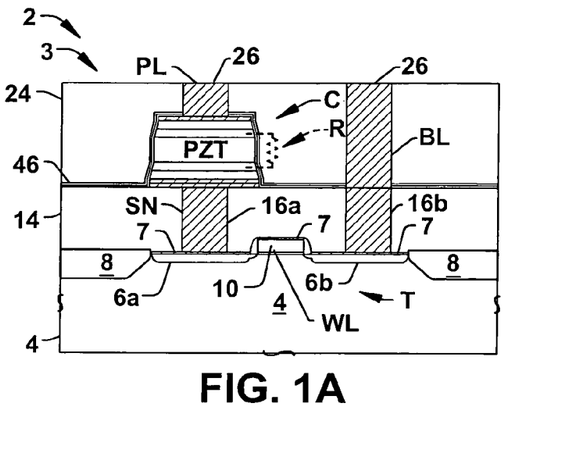
FIG. 1A is a partial side elevation view in section illustrating an exemplary 1T1C ferroelectric memory cell in a portion of a semiconductor device in accordance with one or more aspects of the invention having a ferroelectric cell capacitor with an integral parallel resistor.
Figure 1B:
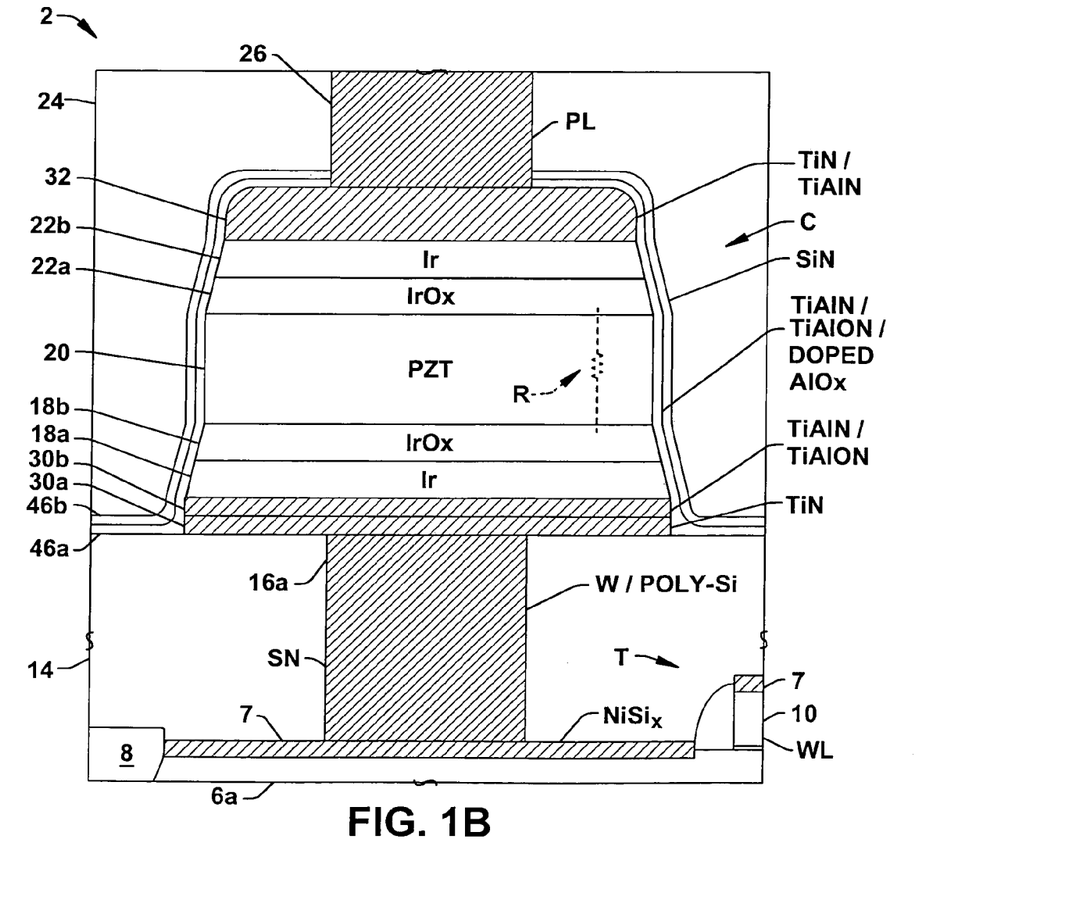
FIG. 1B is a partial side elevation view in section further illustrating the ferroelectric cell capacitor structure and integral resistor in the memory cell of FIG. 1A.
Figure 1C:
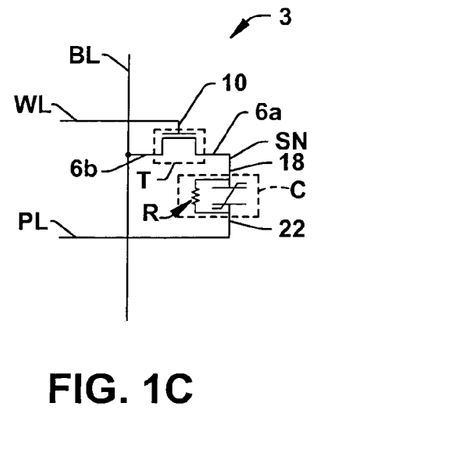
FIG. 1C is a partial schematic diagram illustrating the exemplary ferroelectric memory cell of FIGS. 1A and 1B.

FIGS. 1A–1C illustrate an exemplary ferroelectric memory cell 3 (e.g., a single transistor, single capacitor or 1T1C cell) with a cell transistor T and a ferroelectric cell capacitor C in a semiconductor device 2 formed in a wafer comprising a silicon substrate 4. In accordance with various aspects of the invention, the exemplary memory cell 3 further comprises a cell resistor R that is integrated into the cell capacitor C to provide a resistance between the capacitor electrodes (e.g., in parallel with the ferroelectric cell capacitor C). Although the exemplary device 2 employs 1T1C cell structures 3 that may be configured in a folded bitline array, the various aspects of the invention are not limited to any particular cell type or array architecture, and may alternatively be employed with 2T2C cells or other cell types, as well as in other array architectures, wherein all such alternative implementations are contemplated as falling within the scope of the present invention and the appended claims.

As illustrated in FIGS. 1A and 1C, the exemplary cell transistor T is an n-channel MOS transistor (NMOS) having a gate structure 10 with a gate dielectric between a conductive gate electrode and a channel region of the substrate 4, as well as source/drains 6 formed on either side of the channel in an active region located between STI isolation structures 8, and conductive silicide structures 7 formed on the transistor source/drains 6 and the gate 10. Although the exemplary device 2 employs MOS transistors T, any form of switching device may be employed to provide selective access to the memory cells of the invention. The exemplary transistor T comprises a bitline terminal BL (e.g., source/drain 6b in FIGS. 1A–1C), a storage node terminal SN (source/drain 6b coupled to the capacitor C), and a wordline control terminal WL (gate 10).

A pre-metal dielectric (PMD) 14 is provided above the substrate 4 to cover the cell transistor T, where any suitable dielectric material and thickness may be used for the PMD layer 14. A conductive storage node contact 16a and a conductive bitline contact 16b are formed through the PMD layer 14 using any suitable materials and dimensions (e.g., tungsten (W), polysilicon, or other conductive material) to connect with the silicide structures 7 of the cell transistor source/drains 6, wherein the conductive polysilicon electrode of the gate 10 forms a memory array wordline connection in the illustrated device 2.

The ferroelectric memory cell capacitor C is formed above the cell storage node source/drain contact 16a (e.g., above the PMD level), and comprises a bilayer lower electrode diffusion barrier structure 30a, 30b, and a bilayer lower or bottom electrode 18a, 18b that is coupled with the cell storage node SN via the contact 16a through the diffusion barrier 30. The capacitor C further comprises an overlying ferroelectric material 20 (PZT in this example), and a bilayer upper or top electrode 22 above the PZT 20 that forms a cell plateline node, where the ferroelectric material 20 is situated wholly or at least partially between the electrodes 18 and 22. A bilayer sidewall or upper diffusion barrier 46a, 46b is located over the patterned ferroelectric capacitor C, including a doped aluminum oxide, TiAlN, TiAlN, TaSiN, TiSiN, TiN, TaN, HfN, ZrN, HfAlN, CrN, TaAlN, CrAlN, or TiAlON material 46a (e.g., TiAlN or TiAlON in one example) and a silicon nitride material SiN 46b, where the exemplary barrier 46 operates to prevent or inhibit hydrogen diffusion into the ferroelectric material 20 during fabrication processing.

A first inter-level or inter-layer dielectric layer (ILD0) 24 is formed over the barrier 46, and conductive contacts 26 are formed through the dielectric 24 (and through the barrier 46) to couple with the upper capacitor electrode 22 (plateline node PL) and to couple an overlying bitline routing structure (FIG. 4I below) with the bitline contact 16 in the PMD level 14, wherein the device 2 may include further overlying metalization layers or levels (not shown). In accordance with the invention, moreover, a parallel cell resistor R is integrated into the ferroelectric material 20 and/or into the barrier 46, as described further below, to inhibit off-state charging (e.g., or discharging) of the storage node when the cell 3 is not being accessed, while allowing normal read/write/restore operations when the cell 3 is accessed.

FIG. 1B illustrates further details of the exemplary ferroelectric capacitor C, which comprises a PZT ferroelectric material 20 sandwiched in a vertical patterned capacitor stack structure between a multilayer upper (top) electrode 22a, 22b (collectively referred to as 22) and a multilayer lower (bottom) electrode 18a, 18b (18 collectively), where a remnant portion of a capacitor stack etch hardmask 32 is situated between the upper electrode 22 and an ILD0 plateline contact 26. At least a portion of the lower electrode diffusion barrier 30a, 30b (30 collectively) is formed over the storage node contact 16a in the PMD dielectric 14 at the storage node SN.

Any suitable single or multilayer upper and lower electrodes or diffusion barriers may be employed within the scope of the invention, wherein a lower electrode diffusion barrier layer 30 is not a strict requirement of the invention. The exemplary conductive diffusion barrier 30 is formed on the storage node contact 16a prior to deposition of the lower electrode layers 18a and 18b, for protecting the PMD contact 16a during subsequent processing of the capacitor dielectric 20. The conductive barrier 30 can be any suitable conductive material or materials that prevent or inhibit degradation of the contact 16a, such as TiAlN or other possible barriers (some of which have a slow oxidation rate compared to TiN) which include: TaSiN, TiSiN, TiN, TaN, HfN, ZrN, HfAlN, CrN, TaAlN, CrAlN, or any other conductive material, or stacks or combinations thereof, where the barrier 30a, 30b (30 collectively) is preferably thin, such as having a thickness of about 100 nm or less in one example. The exemplary lower electrode barrier 30 in the device 2 comprises a titanium nitride (TiN) first barrier layer 30a of any suitable thickness (e.g., about 40 nm in one example), and a titanium aluminum nitride (TiAlN) second barrier layer 30b of any suitable thickness, such as about 30 nm in the illustrated implementation. Alternatively, the second barrier layer 30b could be titanium aluminum oxynitride (TiAlON), or a single barrier layer 30 could be formed over all or a portion of the contact 16a, such as TiAlN having a thickness of about 60 nm in one possible implementation, or the barrier 30 may be omitted.

The bottom or lower electrode layers 18 are formed on the barrier 30 so as to be electrically coupled with the underlying contact 16a at the cell storage node SN. In one example, the lower electrode 18 has a total thickness of about 25–100 nm, is stable in oxygen, and comprises a noble metal or conductive oxide such as Ir, $IrO_x$, Pt, Pd, $PdO_x$, Au, Ru, $RuO_x$, Rh, $RhO_x$, $LaSrCoO_3$, $(Ba,Sr)RuO_3$, $LaNiO_3$ or stacks or combinations thereof, although other materials may be used. In cases where PZT material is used for the ferroelectric 20, suitable exemplary bottom electrodes 18 include a 50 nm Ir layer or a stack comprised of 30 nm $IrO_x$ and 20 nm Ir. In the exemplary device 2, a lower Iridium (Ir) layer 18a is formed on the barrier 30b to any suitable thickness, such as about 20 nm, and a lower Iridium Oxide ($IrO_x$) layer 18b is then formed over the lower Ir layer 18a to any suitable thickness, such as about 30 nm, wherein the $IrO_x$ layer 18b may advantageously operate to improve switching endurance fatigue properties by curing oxygen vacancies in the overlying PZT material 20.

The exemplary ferroelectric material 20 is $Pb(Zr, Ti)O_3$ (PZT) having any suitable thickness, such as about 300 to 1000 Å, preferably about 700 Å in one example, where the material 20 may be formed by any suitable deposition method or other material formation technique, such as metal organic chemical vapor deposition (MOCVD) in the device 2, preferably in a manner that avoids or inhibits reduction of the $IrO_x$ material 18b. In accordance with the invention, the properties of the PZT ferroelectric material may be tailored to provide the cell resistor R, thereby integrating the resistor R into the material 20. For example, the ferroelectric material 20 may be a PZT with excess lead (Pb) mole fractions of about 10 percent or more and about 30 percent or less to provide the resistor R having a value that inhibits charge buildup across the ferroelectric capacitor C when the cell 3 is not being accessed without significantly disrupting memory access operations when the cell 3 is being accessed. Another approach is to dope the material 20 with aluminum or other dopant (including but not limited to Ca, Sr, Ba, Ni, Al, La, Co, Fe, Ta, W, Nb, Bi, V, or others) so as to control the resistance thereof. In this regard, the value of the exemplary integral resistor R is about 20 MOHMS (e.g., about 20E6 OHMS) or more and about 100 MOHMS or less, although the invention is not limited to any particular values for the cell resistor R, and any value may be used which inhibits off-state charging or discharging of the storage node SN without significantly disturbing normal memory access operations.

Optional rapid thermal annealing (RTA) or other post-deposition processing may be employed to provide desired material properties of the ferroelectric material 20. In one implementation of the present invention, the ferroelectric material 20 may be doped to provide the resistor R between the electrodes 18 and 22, where the doping may be carried out by a separate implantation process after deposition of the material 20, or the material 20 may be doped in situ with the deposition process. Furthermore, any suitable ferroelectric material 20 may be used, wherein the present invention is not limited to PZT. In the exemplary device 2, moreover, the resistor R may be created by controlling the resistivity (e.g., conductivity) of the ferroelectric material 20 (e.g., whether PZT or other ferroelectric) alone or in combination with a resistive encapsulation layer 46 as described further hereinafter, to provide a resistance between the cell capacitor electrodes 18 and 22, whereby the resistor R is integral to the ferroelectric material 20 and/or to the encapsulation layer 46 and operates as a resistor R in parallel with the cell capacitor C.

The upper electrode 22 includes an upper $IrO_x$ layer 22a formed over the ferroelectric material 20 to any suitable thickness, such as about 100 nm or less, as well as an upper Ir layer 22b formed over the upper $IrO_x$ layer 22a to any suitable thickness, such as about 100 nm or less. In combination with the PZT ferroelectric material 20, other materials may be substituted for the upper $IrO_x$ layer 22a, wherein it is advantageous to have a conductive oxide top electrode such as $IrO_x$, $RuO_x$, $RhO_x$, $PdO_x$, $PtO_x$, $AgO_x$, $(Ba,Sr)RuO_3$, $LaSrCoO_3$, $LaNiO_3$, $YBa_2Cu_3O_{7-x}$ rather than a single pure noble metal, so as to minimize degradation of the PZT 20 due to many opposite state write/read operations (fatigue). Moreover, it is advantageous to have the upper Ir layer 22b or another suitable noble metal layer above the upper oxide layer 22a to provide low resistance for connection of the upper electrode structure 22 to the subsequently formed plateline contact 26 and the hardmask 32, although not a strict requirement of the invention.

A hardmask 32 is formed using any suitable material such as TiN, TiAlN, etc. above the upper Ir layer 22b and patterned using any suitable lithographic techniques for use in selectively etching the upper and lower electrodes and the PZT 20 to define a patterned vertical ferroelectric capacitor structure C as shown in FIG. 1B, although only one of the electrodes need be etched within the scope of the invention. In addition, the single mask 32 is used in the exemplary device 2 for etching the exposed lower electrode diffusion barrier bilayer structure 30a, 30b, wherein the use of a single stack etch mask 32 facilitates scaling the dimensions of the ferroelectric capacitor C in the device 2. The hardmask 32 may be any suitable single or multilayer material and need not remain over the upper electrode following capacitor stack structure patterning.

The device 2 further includes a single or multilayer upper or sidewall diffusion barrier (encapsulation layer) 46 formed over the patterned capacitor stack structure C, which operates to inhibit hydrogen diffusion into the PZT material 20 during subsequent fabrication processing. In one implementation, the barrier 46 includes an aluminum oxide ($AlO_x$) first layer 46a formed over the patterned capacitor C, and a silicon nitride (SiN) second upper diffusion barrier layer 46b formed over the layer 46a.

In another aspect of the invention, the cell resistor R may be formed by the encapsulation layer 46. For example, in the exemplary device 2, the encapsulation barrier layer material 46a is such that a resistance is provided between the capacitor electrode 18 and 22 that inhibits charge buildup across the capacitor C when the cell 3 is not being accessed without significantly disrupting memory access operations when the cell 3 is being accessed, wherein the layer 46 can be any suitable material, thickness, shape, etc. to provide such a resistor R. In one exemplary implementation, the first encapsulation layer 46a comprises aluminum oxide doped with Cr, Ge, Ir, Mn, Nb, Ru, Sn, Ta, Ti, V, W, or other dopants, titanium aluminum nitride (TiAlN), or titanium aluminum oxynitride (TiAlON), wherein the barrier material 46a can be formed to provide the resistor R as-deposited, or may be processed post-deposition, such as by implantation or other doping technique to provide the resistor R giving a desired resistance between the electrodes 18 and 22.

It is noted that where the resistor R is integrated (wholly or partially) into the encapsulation layer 46, that the layer 46 may by a multi-layer structure with other materials suited to inhibit diffusion of hydrogen into the ferroelectric 20. Thus, in the exemplary device 2, the silicon nitride layer 46b is provided over the first encapsulation layer 46a. Furthermore, the resistor R can be integrated into both the ferroelectric material 20 and the encapsulation layer 46, wherein the resistances of each of these are both in parallel with the capacitor C such that the resulting integral resistor R is provided having the desired resistance value.

Following formation of the encapsulation or barrier layer(s) 46, an ILD0 material 24 is then formed over the barrier 46, and conductive contacts 26 are formed through the ILD0 24 for connection to the upper electrode of the capacitor C (e.g., plateline connection), where the plateline contact 26 may be coupled to the Ir layer 22b through a portion of the remaining hardmask 32, as shown in FIG. 1B, or may be directly connected to the upper Ir 22b.

Referring now to FIGS. 2–4I, FIGS. 2 and 3 illustrate exemplary methods 100 and 200, respectively, in accordance with the invention, and FIGS. 4A–4I illustrate the exemplary device 2 above at various stages of fabrication processing. Although the methods 100 and 200 are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods of the present invention may be implemented in association with the fabrication of memory cells and cell capacitor structures illustrated and described herein (e.g., the ferroelectric capacitor C and the cell 3 in the exemplary device 2) as well as in association with other memory cells and capacitors not illustrated.

Also, while the following examples illustrate ferroelectric capacitors formed using various exemplary materials, such as PZT ferroelectric material 20 and various materials for the electrodes and barriers, the invention may be employed in association with ferroelectric capacitors fabricated with any suitable dielectric, electrode, and barrier materials, wherein all such variant implementations are contemplated as falling within the scope of the present invention. In addition, while the exemplary semiconductor devices are illustrated herein with ferroelectric capacitors C formed in a dielectric layer or level (ILD0 24 in FIGS. 1A and 1B) after front-end contact formation and prior to formation of overlying metalization levels, the various aspects of the invention may be employed at other points in a fabrication process, for example, wherein the ferroelectric capacitors are formed at any level in a multi-level semiconductor device design. Further, the invention may be employed in semiconductor devices (e.g., integrated circuits) fabricated on or in any type of semiconductor body, including but not limited to silicon substrates (e.g., such as the semiconductor body 4 in the device 2), SOI wafers, epitaxial layers formed above a substrate, etc. In this regard, the invention is not limited to the examples illustrated and described herein, wherein all such alternative implementations are contemplated as falling within the scope of the present invention and the appended claims.

Figure 2:
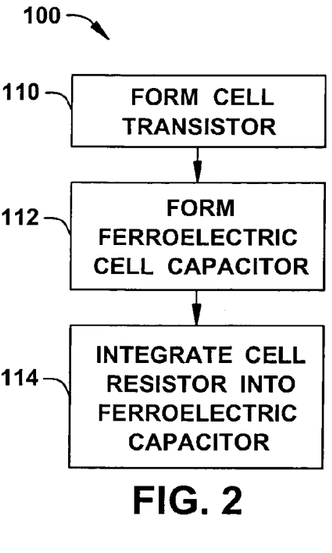
FIG. 2 is a flow diagram illustrating a process for fabricating a ferroelectric memory cell with a cell transistor switching device, a ferroelectric cell capacitor, and an integral parallel resistor in accordance with one or more aspects of the present invention.

FIG. 2 illustrates an exemplary method 100 for fabricating a ferroelectric memory cell with a cell transistor switching device, a ferroelectric cell capacitor, and an integral parallel resistor in accordance with one or more aspects of the present invention. The method 100 comprises forming a cell transistor at 110, forming a ferroelectric cell capacitor at 112, and integrating a cell resistor into the ferroelectric cell capacitor at 114. In the exemplary device 2 (FIG. 1A), a MOS transistor T is formed at 110 having a bitline terminal 6b, a storage node terminal 6a, and a control terminal 10, wherein the ferroelectric capacitor structure C is formed at 112 so as to be coupled with the transistor storage node terminal 6b via the contact 16a. As discussed above, moreover, the cell resistor R is formed at 114 integral to the capacitor C, so as to provide a resistance between the capacitor electrodes 18 and 22.

Figure 3:
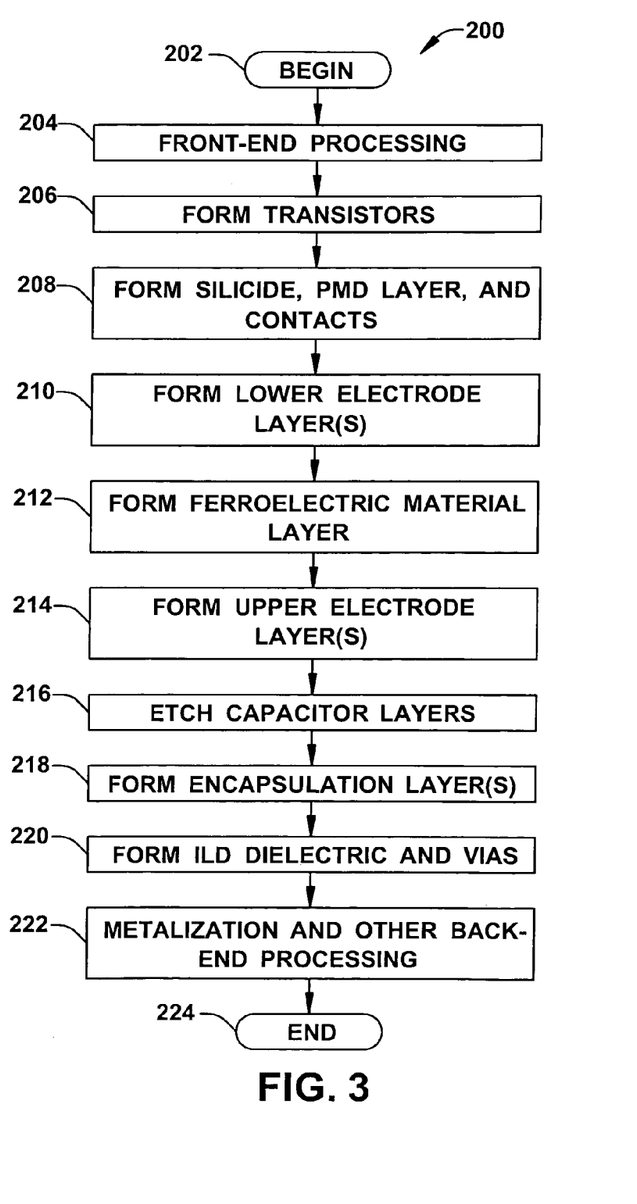
FIG. 3 is a detailed flow diagram illustrating an exemplary method of semiconductor device fabrication, including integration of parallel memory cell resistors in the creation of the cell capacitors according to the invention.

Referring also to FIGS. 3 and 4A–4I, FIG. 3 illustrates a more detailed semiconductor device fabrication method 200 including formation of ferroelectric memory cells and the capacitor structures thereof in accordance with the present invention, and FIGS. 4A–4I illustrate the exemplary device 2 of FIGS. 1A–1C above undergoing fabrication processing generally according to the methods 100, 200 of FIGS. 2 and 3, respectively. The method 200 begins at 202 in FIG. 3, wherein front-end processing is performed at 204, such as creation of n and p-wells in the semiconductor body 4 and isolation structures (e.g., shallow trench isolation (STI) structures 8 in FIG. 4A or field oxide structures formed using local oxidation of silicon (LOCOS) techniques) in field areas of the wafer.

Figure 4A:
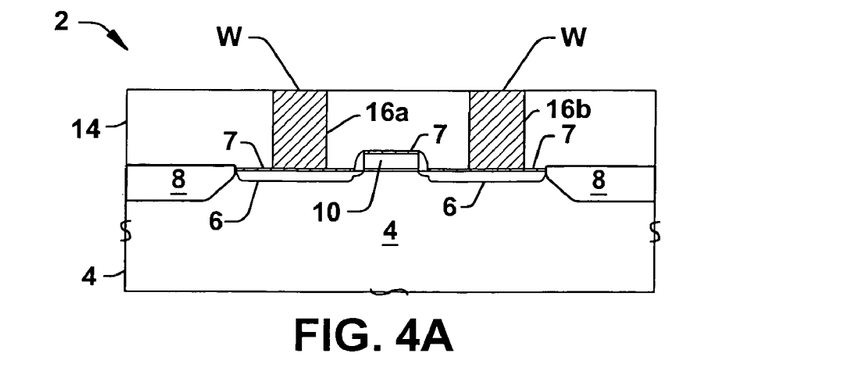
FIGS. 4A–4I are partial side elevation views in section illustrating formation of a ferroelectric memory cell ferroelectric capacitor stack in the device of FIGS. 1A–1C generally according to the fabrication process of FIG. 3 in accordance with the invention.

At 206, transistors are formed for logic or analog circuitry and for ferroelectric memory cells (e.g., the exemplary memory cell transistor T is formed in the semiconductor body 4 in FIG. 4A). At 208, silicide structures 7 are formed at the transistor terminals (e.g., source/drains and gate), an initial dielectric material is formed over the transistors, referred to herein as a pre-metal dielectric (PMD layer 14 in FIG. 4A), and conductive contacts 16 (e.g., tungsten, polysilicon, or other conductive material) are formed through the PMD layer for connection to the silicide 7 at the cell transistor bitline source/drain 6 as well as the source/drain 6 for connection at a cell storage node with the subsequently formed ferroelectric cell capacitor C. Any suitable dielectric material 14 of any desired thickness can be employed at 208 in forming the initial PMD layer 14, wherein a selective etch process is employed to create openings into which tungsten or other conductive material 16 is provided to create the conductive contacts 16a and 16b, as illustrated in FIG. 4A.

At 210–214, ferroelectric capacitor layers are formed over the PMD layer 14 and the contacts 16 thereof (FIGS. 4B–4D), including formation of upper and lower conductive capacitor electrode and diffusion barrier layers 30, 18, 22, as well as a ferroelectric material (PZT) layer 20 between the electrode layers 18 and 22. A bilayer conductive bottom or lower electrode diffusion barrier structure 30 is initially created at 210 comprising a TiN layer 30a formed over the PMD dielectric 14 and the PMD tungsten contacts 16 (FIG. 4B) to a thickness of about 4 nm via sputtering, chemical vapor deposition (CVD), or other suitable material deposition process, although other materials and processes may be employed, including but not limited to TaSiN, TiSiN, TiN, TaN, HfN, ZrN, HfAlN, CrN, TaAlN, CrAlN, or any other conductive material 30 formed to any suitable thickness. When tungsten (W) is used for the contacts 16, it is preferred to deposit a bilayer diffusion barrier 30a and 30b, as in the exemplary device 2. In this example, a TiAlN or TiAlON layer 30b is deposited to any suitable thickness, such as about 30 nm over the TiN layer 30a.

Figure 4B:
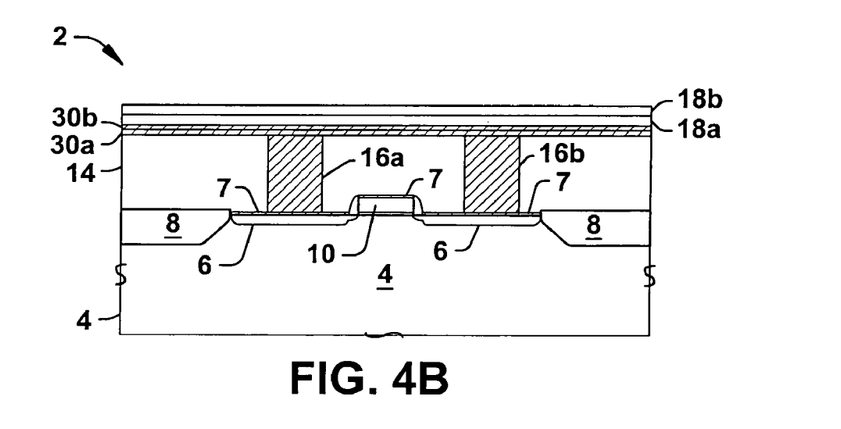

The lower electrode layers 18 are also formed at 210, wherein an initial lower electrode metal layer 18a is formed over the barrier 30, as illustrated in FIG. 4B. In the exemplary device 2, the layer 18a is Ir deposited by a sputter deposition process to a thickness of about 20 nm, although CVD or PVD processes and other materials and thicknesses could alternatively be employed. Other suitable conductive materials can be used for the layer 18a, including but not limited to $IrO_x$, Pt, Pd, $PdO_x$, IrPt alloys, Au, Ru, $RuO_x$, (Ba, Sr, Pb)$RuO_3$, (Sr, Ba, Pb)$IrO_3$, Rh, $RhO_x$, $LaSrCoO_3$, etc., or any stack or combination thereof. Thereafter, a metal oxide layer 18b is formed, such as a lower $IrO_x$ deposited using a PVD or sputter deposition process to a thickness of about 30 nm in the exemplary device 2.

Figure 4C:
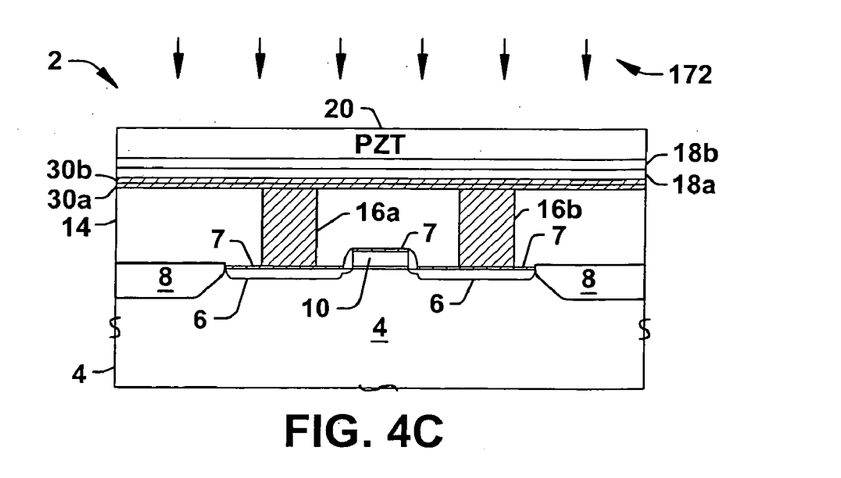

A Pb(Zr, Ti)$O_3$ (PZT) ferroelectric material 20 is then formed over the lower $IrO_x$ layer 18b at 212, as illustrated in FIG. 4C. The material 20 may be deposited at 212 over the lower electrode material 18b using any appropriate deposition process 172, such as metal organic chemical vapor deposition (MOCVD) using any suitable ferroelectric materials, including but not limited to Pb(Zr, Ti)$O_3$ (lead zirconate titanate, PZT), doped PZT with donors (Nb, La, Ta) acceptors (Mn, Co, Fe, Ni, Al) and/or both, or PZT doped and alloyed with $SrTiO_3$, $BaTiO_3$ or $CaTiO_3$, or stacks or combinations thereof, or other (e.g., non-PZT) ferroelectric material formed to any desired thickness (e.g., 300 to 1000 Å, preferably about 700 Å in the illustrated example).

As discussed above, one aspect of the invention involves integrating the cell resistor R into the ferroelectric material 20. For example, the properties of the PZT ferroelectric material 20 formed at 212 may be tailored to provide the desired resistance, such as by forming PZT 20 having excess lead (Pb) mole fractions of about 10 percent or more and about 30 percent or less to provide the resistor R having a value of about 20E6 to about 100E6 OHMS in the exemplary device 2. In general, the resistance value of the resistor R is tailored so as to inhibit charge buildup across the ferroelectric capacitor C when the cell 3 is not being accessed without significantly disrupting memory access operations when the cell 3 is being accessed, wherein the invention is not limited to any particular values for the cell resistor R. Another possible approach involves doping the ferroelectric material 20 at 212, whether in situ or post-deposition, or both, to provide the resistor R. In general, any ferroelectric material or materials 20 may be employed, wherein the conductivity (resistivity) thereof may be tailored to provide the desired resistor R, whether alone or in combination with providing a resistive tailored encapsulation layer 46, wherein all such implementations are contemplated as falling within the scope of the invention and the appended claims.

Figure 4D:
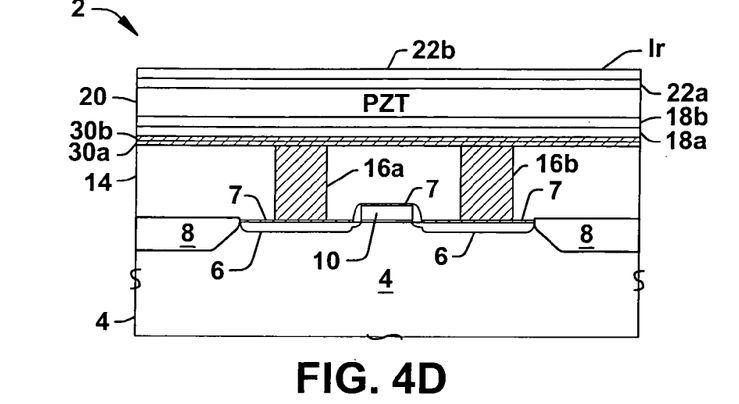

Referring now to FIGS. 3 and 4D, after the deposition of the PZT material 20 at 212, the exemplary upper electrode layers 22 are formed at 214 using any suitable conductive material or materials, such as Ir, $IrO_x$, $RuO_x$, $RhO_x$, $PdO_x$, $PtO_x$, $AgO_x$, (Ba, Sr)$RuO_3$, $LaSrCoO_3$, $LaNiO_3$, $YBa_2Cu_3O_{7-x}$ with a noble metal layer thereover, or stacks or combinations thereof. In the illustrated device 2, the upper electrode 22 is a bi-layer comprising an upper $IrO_x$ layer 22a formed over the PZT 20, and an Ir layer 22b formed over the $IrO_x$ layer 22a, wherein the electrode layers 22 may be formed at 214 to any desired thickness using any suitable processes in accordance with the invention. In the illustrated example, an upper $IrO_x$ layer 22a is formed at 214 on top of the ferroelectric material 20 via a sputter deposition process or reactive PVD process to a thickness of about 100 nm or less (e.g., about 30 nm in one example). In addition, an upper Ir layer 22b or other suitable metal is deposited at 214, wherein the exemplary upper Ir layer 22b is deposited to a thickness of about 100 nm or less over the upper $IrO_x$ 22a in the device 2, as shown in FIG. 4D. Any suitable deposition process or processes, conductive materials, and thicknesses can be employed at 214 in forming the upper electrode 22.

Figure 4E:
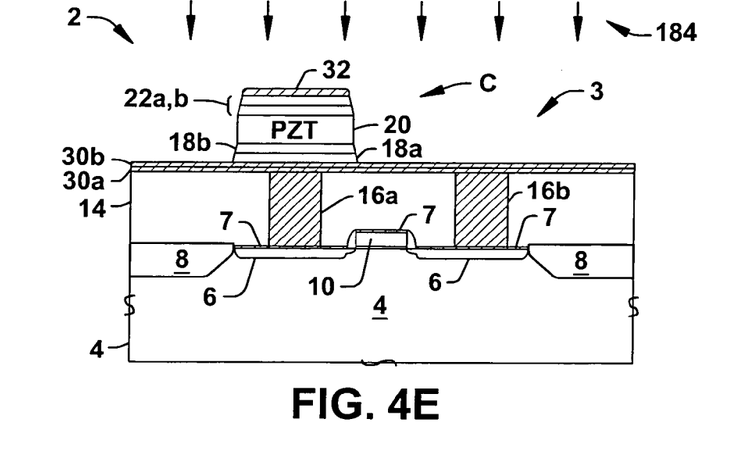

Referring also to FIG. 4E, the capacitor layers are then etched or otherwise patterned at 216 to form a patterned ferroelectric capacitor stack structure. In the exemplary device 2, a TiN or TiAlN hard mask layer 32 is formed (e.g., deposited over the upper Ir layer 22b) and then patterned to cover portions of the underlying layers 22, 20, 18, and 30 in a prospective capacitor region of the device 2, and to expose the remainder of the device 2. The capacitor stack structure is then patterned at 216 using one or more etch processes 184 (e.g., reactive ion etching (RIE) or other etch process using suitable etch chemistries tailored to the layers being removed), and may thereafter undergo one or more post-etch cleaning operations, thereby defining a patterned ferroelectric capacitor structure C, as illustrated in FIG. 4E. In this implementation, the etch process 184 then continues at 143 to remove exposed portions of the lower electrode and diffusion barrier layers 18 and 30, as shown in FIG. 4E, although not a strict requirement of the invention.

Figure 4F:
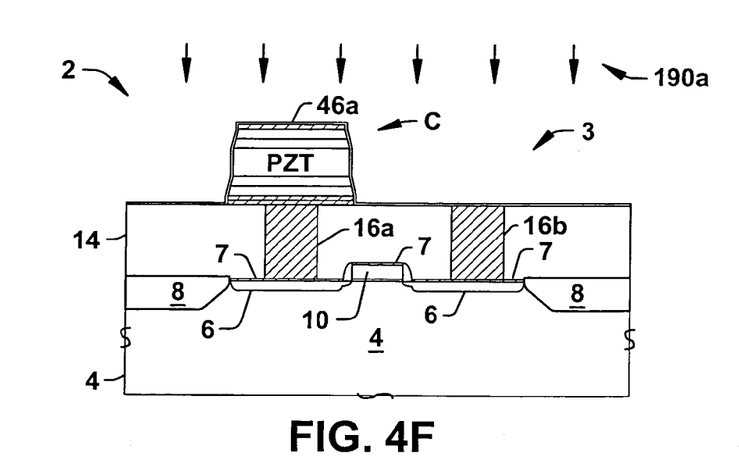
Figure 4G:
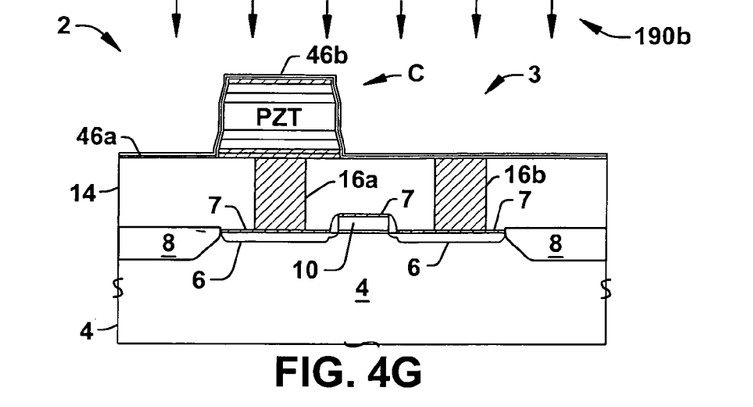

Referring also to FIGS. 4F and 4G, in accordance with the present invention, an optional encapsulation layer 46 may be formed at 218 over all or a portion of the patterned ferroelectric capacitor structure C, which is in contact with the electrodes 18 and 22 and provides a resistance therebetween. Where the resistor R is integrated into the ferroelectric material 20, the encapsulation layer 46 may be omitted or constructed for operation as a hydrogen diffusion barrier. Alternatively, the cell resistor R may be integrated into both the encapsulation layer 46 and the ferroelectric material 20, wherein the resistances thereof are in parallel. Furthermore, the exemplary cell resistor R preferably provides a substantially linear I-V characteristic.

In the exemplary device 2, the encapsulation layer 46 comprises a doped aluminum oxide layer 46a formed over at least a portion of the ferroelectric capacitor structure C via a deposition process 190a, as illustrated in FIG. 4F, whereby a resistance is integrated into the capacitor structure C, wherein the layer 46a may also serve to prevent or inhibit hydrogen diffusion into the ferroelectric material 20 in subsequent (e.g., back-end) processing of the device 2. When used to form all or a part of the cell resistor R, the material and thickness of the layer 46a may be made to set the desired resistance thereof. In one example, the layer 46a is titanium aluminum nitride (TiAlN) or titanium aluminum oxynitride (TiAlON) formed at 218 by any suitable deposition process 190a, although other suitable materials can be used. Thereafter, a silicon nitride (SiN) second encapsulation or diffusion barrier layer 46b is formed at 218 via a plasma enhanced chemical vapor deposition (PECVD) process 190b, as illustrated in FIG. 4G, to further inhibit hydrogen diffusion.

Figure 4H:
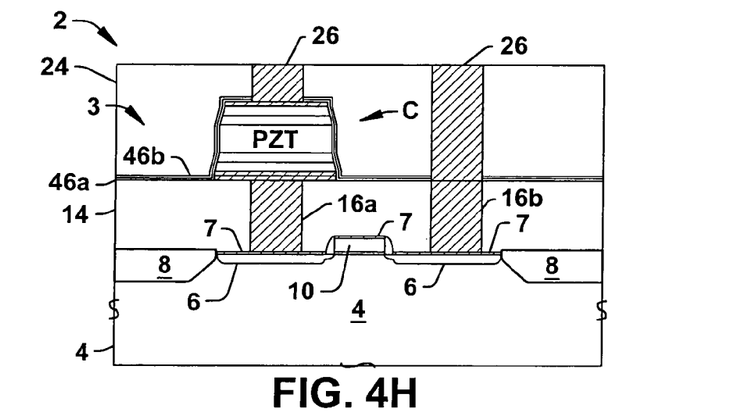
Figure 4I:
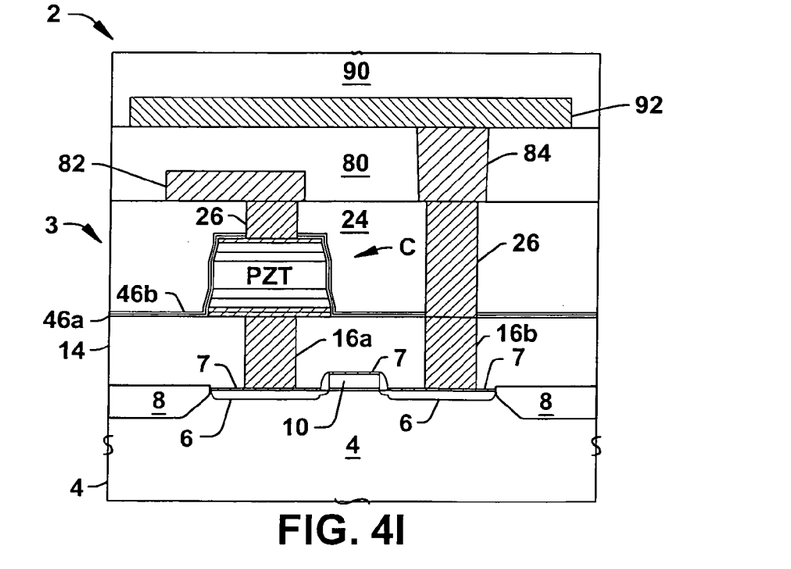

An inter-level dielectric (e.g., ILD0) is deposited at 220 (layer 24 in FIG. 4H), which is then selectively etched to form via/contact openings for electrical coupling to the upper ferroelectric capacitor electrode 22 and to the previously formed bitline contact 16b in the underlying initial PMD layer 14. The ILD0 openings are then filled with conductive material (e.g., copper, aluminum, tungsten, or other conductive material) to form the bitline and capacitor plateline contacts or vias 26 in the ILD0 layer (e.g., ILD0 vias (V0) in the capacitor level), as shown in FIG. 4H. The ILD material 24 may be silicon dioxide ($SiO_2$), FSG, or other suitable dielectric. Thereafter, further metalization levels can be formed at 222, as shown in FIG. 4I, including another ILD material 80 (e.g., ILD1 level) with a conductive plateline routing structure 82 and an ILD1 bitline via 84, as well as an overlying ILD2 dielectric 90 in which a conductive (e.g., copper) bitline routing structure 92 is formed, after which other back-end processing is performed (not shown) to complete the device 2, and the exemplary fabrication method 200 ends at 224.

Figure 5:
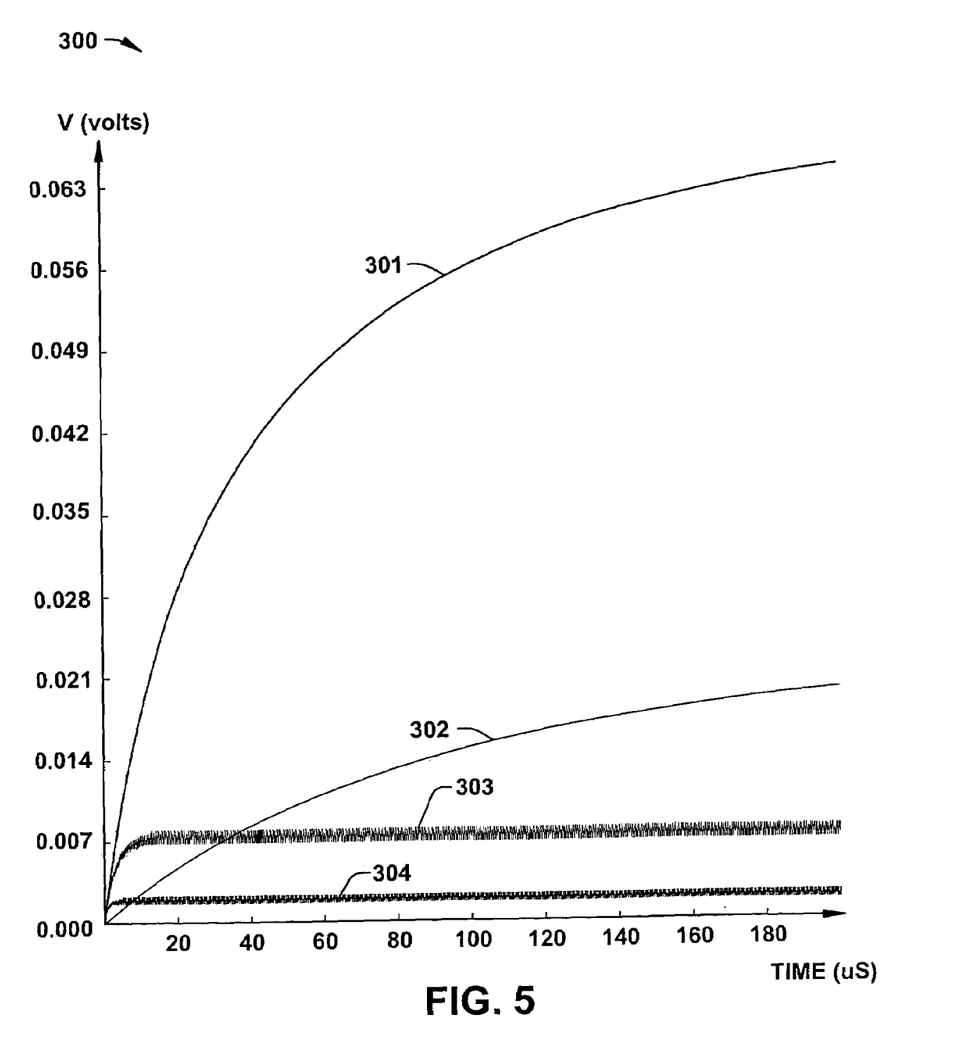
FIG. 5 is a graph illustrating storage node voltage of non-accessed ferroelectric memory cells as a function of time showing storage node charge accumulation for cells with and without the integral parallel resistor of the present invention.
Figure 6:
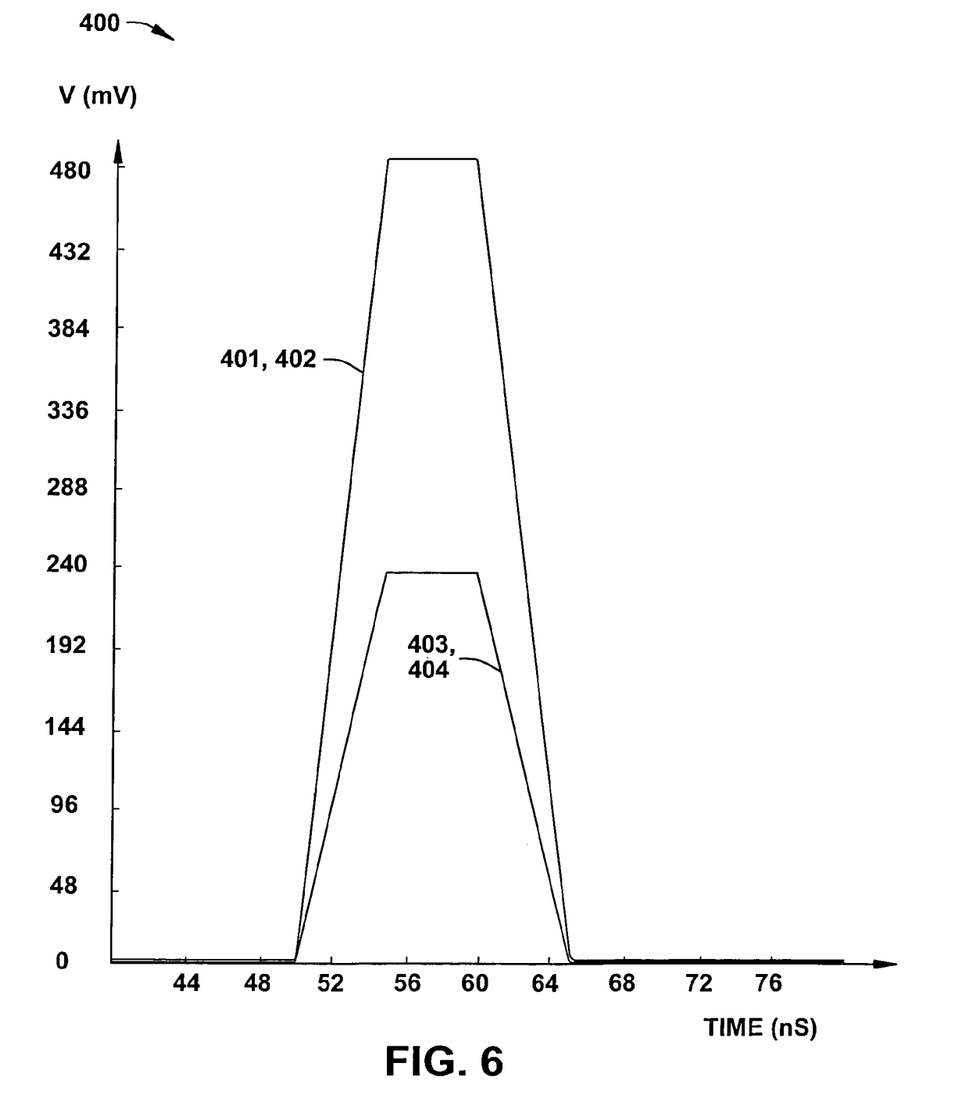
FIG. 6 is a graph illustrating voltages across a ferroelectric cell capacitor during a plateline pulse for "0" and "1" data states for cells with and without the integral resistor of the invention.

Referring now to FIGS. 1C, 5, and 6, the inventors have appreciated that leaky cell transistors can cause unwanted charging or discharging of a ferroelectric memory cell storage node SN where the transistor T and cell capacitor C are coupled together. Absent the countermeasures of the present invention, off-state (e.g., non-accessed) cells are in theory isolated from array bitlines, since the cell transistor is off (e.g., the unselected wordline control signals are inactive). However, transistor leakage can result in charge transfer between the bitline and the cell storage node when voltages at these nodes are different, wherein charge may build up at the storage node over time.

In addition, certain array architectures provide plateline pulses to selected as well as non-selected array rows, such as where a single plateline driver circuit is shared among several array rows. In this case, the plateline pulse signal is applied to the non-selected cell capacitor. If the cell transistor leaks, the storage node voltage may not track the plateline voltage, whereby the storage node may again acquire or lose charge through the transistor. Moreover, the inventors have appreciated that continuing scaling efforts in the manufacture of advanced semiconductor products lead to reduced transistor channel lengths and increased likelihood of memory cell transistor leakage.

The approach of the present invention involves integration of a resistor R into the construction of the ferroelectric cell capacitor C. This resistor R provides a resistive path in parallel with the cell capacitor C to counteract storage node voltage changes when the cell 3 is not being accessed. In this regard, the resistance value of the resistor R is advantageously made low enough that the data maintained by polarization of the ferroelectric material 20 will not be corrupted or disturbed while the cell transistor T is off. Further, the resistance is high enough to allow normal memory access operations, such as read, write, and restore actions in which the cell transistor T is on.

Thus, whereas previous capacitor design goals typically sought to decrease cell capacitor leakage, the present invention is directed to providing a controlled resistance in parallel with the cell capacitor C. In particular, the invention may be advantageously employed to provide enough capacitor leakage (e.g., low enough parallel resistance) to prevent or inhibit excessive charging or discharging of the storage node SN over long periods of time when the cell 3 is not accessed (e.g., to compensate for or counteract cell transistor leakage), while limiting the capacitor leakage (e.g., high enough parallel resistance) so that normal memory access operations are not significantly disrupted (the parallel resistor does not significantly disturb the switching of the ferroelectric capacitor when the transistor T is on and a plateline signal pulse is applied at the plateline node PL).

FIG. 5 provides a graph 300 illustrating of non-accessed ferroelectric memory cell voltage vs. time curves showing storage node charge accumulation for cells with and without the integral parallel resistor of the present invention. Several exemplary curves 301, 302, 303, and 304 are illustrated in the graph 300, corresponding to ferroelectric cell capacitors C subjected to plateline pulses (e.g., at the plateline node PL in FIG. 1C) with the cell transistor T off (e.g., the wordline signal WL low). The first two curves 301 and 302 illustrate the voltage at the cell storage node (e.g., node SN in FIG. 1C) for two cases where no cell resistor R is present, for MOS transistor channel lengths of 0.15 μm and 0.2 μm, respectively. As can be seen in the curves 301 and 302, the reduction of the cell transistor channel length worsens the amount of voltage built up at the storage node SN, wherein smaller cell designs are more prone to storage node disturbance, particularly where non-accessed cells are provided with plateline pulses. However, even the larger transistor channel length case of the curve 302 may lead to unacceptable performance of the memory cell 3.

The curve 303 illustrates the cell storage node voltage in the case where the cell transistor T has the shorter exemplary channel length of 0.15 μm, and the cell resistor R of the present invention provides a resistance of about 100 MOHM between the plateline and storage nodes PL and SN, respectively, and has a substantially linear current-voltage (I-V) characteristic. Comparing the curves 301 and 303, the provision of 100 MOHMs of resistance in parallel with the cell capacitor C significantly reduces the charge buildup across the capacitor C. Curve 304 illustrates another case where the cell transistor channel length is again 0.15 μm, with the cell resistor R having a value of about 20 MOHMS. Comparing the curves 303 and 304, the lower resistance value of about 20 MOHMS further inhibits charge buildup at the storage node SN when the cell 3 is not being accessed in accordance with the invention.

Referring also to FIG. 6, a graph 400 is provided, which illustrates voltages across a ferroelectric capacitor C of an accessed cell 3 during a plateline pulse for "0" and "1" data states for cells with and without the integral resistor of the invention. Curves 401 and 402 illustrate storage node voltages during a plateline pulse reading a capacitor C polarized in a first direction (data "1"), without a cell resistor R and with a cell resistor R having a value of about 20 MOHM, respectively, wherein the voltage difference between the curves 401 and 402 is essentially negligible (e.g., less than about 3 mv in the illustrated example). Thus the resistance (20 MOHMS) of the cell resistor R in this case does not significantly disrupt memory access operations for data "1"

state when the cell 3 is accessed. Curves 403 and 404 illustrate the cases of no resistor R and a 20 MOHM resistor R, respectively for the data "0" state, where again, no significant disruption is caused by the inclusion of the resistor R (e.g., the voltage difference is again less than about 3 mv). It is noted with respect to disturbing read, write, and/or restore operations, that increasing the resistance value to 100 MOHMS will result in even less effect when the cell 3 is being accessed. Thus, tight control over the value of the resistor R is not necessary, wherein the resistance value thereof may vary by as much as one or more orders of magnitude, while still operating to inhibit storage node charging or discharging when the cell 3 is not being accessed without significantly disrupting memory access operations when the cell 3 is being accessed.

In general, the resistance of the cell resistor R may be set according to the specifics of a given application, taking into account various factors including but not limited to the cell transistor leakage characteristics (e.g., channel length, process variations, etc.), the cell capacitor parameters (e.g., size, material, etc.), disturb voltage levels in a given cell design, signal margin for a given array sense amp design, and the voltage levels and durations of various signals used in a ferroelectric memory array (e.g., plateline pulse amplitude and duration), whereby the resistance of the resistor R is made low enough that the data maintained by polarization of the ferroelectric material 20 will not be corrupted or disturbed while the cell transistor T is off, and the resistance is high enough to allow normal memory access operations, such as read, write, and restore actions in which the cell transistor T is on.

Figure 7:
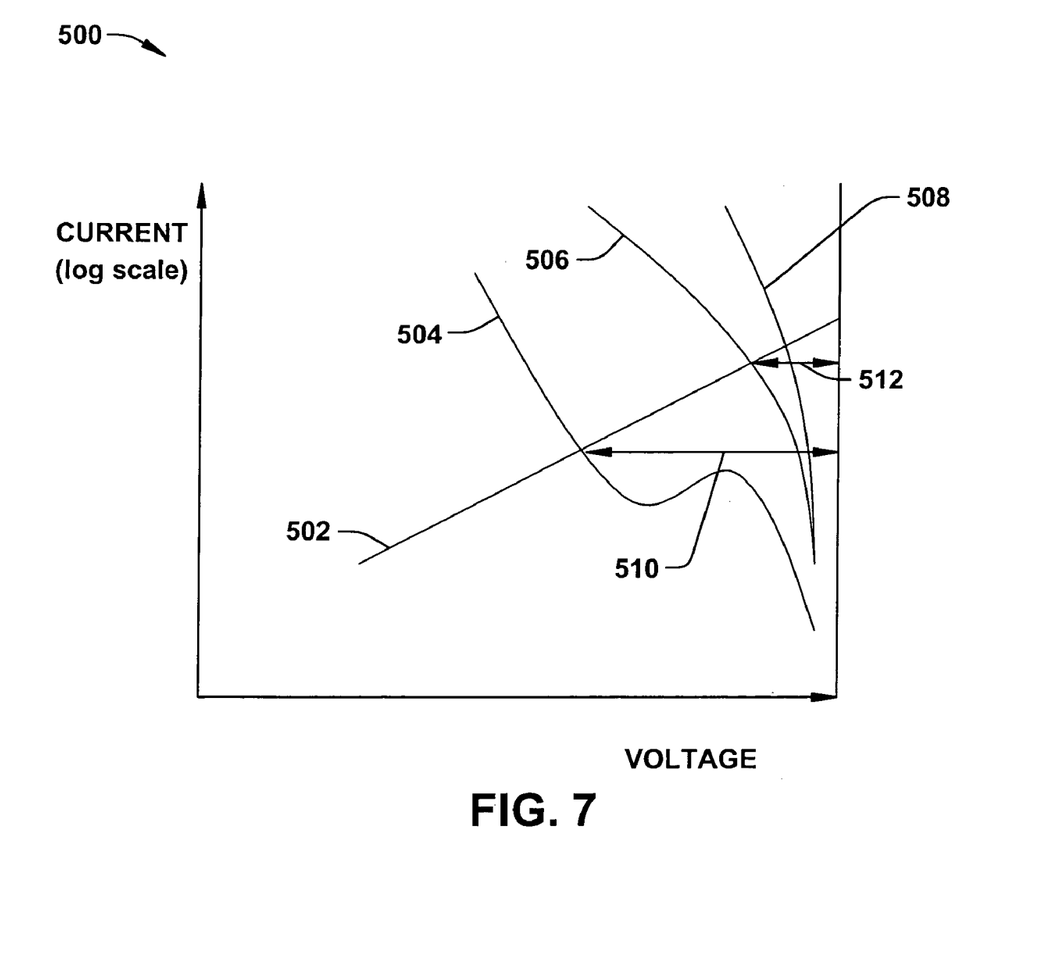
FIG. 7 is a plot illustrating exemplary current and voltage characteristics for selecting a resistance value for the integral cell resistor.

Referring also to FIG. 7, a load line drawing plot 500 is provided, illustrating exemplary characteristics for a 100% duty cycle case to illustrate one technique for determining a maximum resistance for the cell resistor R. The plot 500 shows current (log scale) and voltage relationships for transistor off-state leakage current $I_{OFF}$ 502, together with a curve 504 showing a ferroelectric capacitor leakage load line, wherein a voltage difference 510 is shown representing the disturb voltage limited only by the ferroelectric capacitor leakage. In addition, the plot 500 illustrates exemplary maximum and minimum resistance load lines 506 and 508, respectively, wherein a voltage difference 512 illustrates the disturb voltage controlled by the parallel cell resistor R corresponding to the illustrated maximum resistance curve 506.

The maximum resistance value for the cell resistor R can in general be determined by three factors, including a maximum allowable disturb voltage (e.g., typically less than about ten percent of the supply voltage VDD), the I-V characteristics of the off-state transistor (e.g., the transistor leakage), and the maximum plateline and bitline duty cycles for a non-selected memory cell at opposite voltage rails (e.g., typically less than about fifty percent duty cycle for normal ferroelectric memory sensing, or about one hundred percent for proposed VDD/2 plate line designs. The simulations for one exemplary process show that a resistance value of 100 MOHMs will work properly to keep the disturb voltage far less than 10% of the supply voltage VDD, although other higher values may be used within the scope of the invention.

The minimum resistance value may be determined according to the available signal margin (e.g., wherein a typical design might target less than about 10% loss in signal compared to the non-resistor signal case), the area of the capacitor, and the plate pulsing characteristics (e.g., whether on-pulse or after-pulse sensing is used). For instance, for after pulse sensing, such characteristics of interest would include the plateline pulse width and the time from the pulse falling edge to enablement of the sense amp (e.g., to sensing), whereas for on-pulse sensing, the time from the pulse rising edge to sensing would be a factor. As illustrated in FIG. 6 above, 20 MOHMs results in very low signal loss, where even lower resistance values could be used. Thus, the example range of 20–100 MOHMs is not a strict requirement of the invention.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A ferroelectric memory cell, comprising:
   a switching device comprising a bitline terminal, a storage node terminal, and a control terminal, the switching device being operable to selectively couple an array bitline at the bitline terminal with a cell storage node at the storage node terminal according to a wordline signal at the control terminal; and
   a ferroelectric capacitor structure comprising:
      a first electrode coupled with the switching device at a cell storage node,
      a second electrode forming a cell plateline node,
      a ferroelectric material located at least partially between the first and second electrodes, and
      a cell resistor integral to the ferroelectric capacitor structure, the cell resistor being in contact with the first and second electrodes and providing a resistance between the cell storage node and the cell plateline node that inhibits charge accumulation or charge loss at the cell storage node when the cell is not being accessed without significantly disrupting memory access operations when the cell is being accessed, and wherein the cell resistor further comprises an encapsulation layer extending over a top portion of the second electrode and between the first and second electrodes and providing the resistance between the cell storage node and the cell plateline node.

2. The ferroelectric memory cell of claim 1, wherein the cell resistor further comprises a structure that is integral to the ferroelectric material.

3. The ferroelectric memory cell of claim 2, wherein the ferroelectric material comprises PZT with excess Pb mole fractions of about 10 percent or more and about 30 percent or less.

4. The ferroelectric memory cell of claim 2, wherein the ferroelectric material comprises doped PZT.

5. The ferroelectric memory cell of claim 1, wherein the encapsulation layer comprises doped aluminum oxide.

6. The ferroelectric memory cell of claim 1, wherein the encapsulation layer comprises at least one of titanium aluminum nitride and titanium aluminum oxynitride.

7. The ferroelectric memory cell of claim 1, wherein the cell is a single transistor, single capacitor memory cell.

8. The ferroelectric memory cell of claim 1, wherein the cell resistor provides a substantially linear I-V characteristic.

9. The ferroelectric memory cell of claim 1, wherein the cell resistor provides a resistance of about 20E6 OHMS or more between the cell storage node and the cell plateline node.

10. The ferroelectric memory cell of claim 9, wherein the cell resistor provides a resistance of about 100E6 OHMS or less between the cell storage node and the cell plateline node.

11. The ferroelectric memory cell of claim 1, wherein the cell resistor provides a resistance of about 100E6 OHMS or less between the cell storage node and the cell plateline node.

12. The ferroelectric memory cell of claim 1, wherein the switching device is a MOS transistor.

* * * * *